United States Patent
Mil'shtein et al.

(10) Patent No.: US 6,833,571 B1
(45) Date of Patent: Dec. 21, 2004

(54) TRANSISTOR DEVICE INCLUDING BURIED SOURCE

(75) Inventors: Samson Mil'shtein, Chelmsford, MA (US); Carlos A. Gil, Billerica, MA (US)

(73) Assignee: University of Massachusetts Lowell, Lowell, MA (US)

(*) Notice: Subject to any disclaimer, the term of this patent is extended or adjusted under 35 U.S.C. 154(b) by 0 days.

(21) Appl. No.: 10/188,733

(22) Filed: Jul. 2, 2002

Related U.S. Application Data
(60) Provisional application No. 60/302,476, filed on Jul. 2, 2001.

(51) Int. Cl.[7] .......................... H01L 29/76; H01L 29/94; H01L 29/80
(52) U.S. Cl. .................. 257/282; 257/256; 257/279; 257/280
(58) Field of Search ................ 257/256, 279, 257/280, 282, 287, 288, 304, 327

(56) References Cited

U.S. PATENT DOCUMENTS

| | | | | |
|---|---|---|---|---|
| 3,825,996 A | * | 7/1974 | Barron et al. | 438/148 |
| 4,222,063 A | * | 9/1980 | Rodgers | 257/322 |
| 4,679,298 A | * | 7/1987 | Zuleeg et al. | 29/571 |
| 4,737,469 A | * | 4/1988 | Stevens | 437/33 |
| 5,068,705 A | * | 11/1991 | Tran | 257/273 |
| 5,448,085 A | * | 9/1995 | Calcatera et al. | 257/192 |
| 6,184,555 B1 | * | 2/2001 | Tihanyi et al. | 257/342 |

OTHER PUBLICATIONS

Lee et al, "Self–Aligned Gate MESFET and the Method of Fabricating the Same", US Statutory Invention Registration, Reg. No. H390, Dece,ber 1, 1987.*
IBM Technical Disclosure Bulletin, "Planar Junction Gate Field Effect Transistor", vol. 14, Issue 1, pp. 297 (TDB-AC-C-NO: NN7106297); Jun. 1, 1971.*
IBM Technical Disclosure Bulletin, "Short Channel Vertical JFET Structure", vol. 23, Issue 6, pp. 2567–2571 (TDB-AC-C-NO: NN80112567); Nov. 1, 1980.*

* cited by examiner

Primary Examiner—Nathan J. Flynn
Assistant Examiner—Johannes Mondt
(74) Attorney, Agent, or Firm—Hamilton, Brook, Smith & Reynolds, P.C.

(57) ABSTRACT

A transistor device includes a gate region disposed adjacent to a semiconductor substrate such that a low impedance channel is formed between a source region and drain region of a transistor device when a voltage is applied to its gate. The drain region of the device can be disposed aside the gate region on a common surface of the semiconductor substrate. The source region of the device also can be disposed adjacent to the substrate but on a side of the semiconductor substrate opposing the drain and/or gate regions. Based on this topology, a transistor device can be fabricated with a buried source to enhance its operating characteristics such as switching speed.

7 Claims, 9 Drawing Sheets

Fabrication Technique for Buried Source Transistor

Transistor with Buried Source

I-V Curves for Conventional MESFET (normalized to 1um device)

I-V Curves for Conventional MESFET (normalized to 1um device)

TRANSISTOR DEVICE INCLUDING BURIED SOURCE

RELATED APPLICATION(S)

This application claims the benefit of U.S. Provisional Application Ser. No. 60/302,476 filed Jul. 2, 2001 entitled "Transistor with Buried Source," the entire teachings of which is incorporated herein by this reference.

BACKGROUND OF THE INVENTION

One way to increase the switching speed of a Field Effect Transistor (FET) and increase $f_T$ is to fabricate a standard transistor to be as small as possible. This methodology is generally known as microminiaturization, which has its limitations. For example, a difficulty associated with microminiaturization is the limitation of photolithography techniques in patterning nano-scale devices. The fabrication of the nano-scale devices using photolithography can result in a low yield because the devices are so small. However, when fabrication of a shorter channel FET is achieved, transit time in the channel beneath a gate becomes sufficiently short so that a switching speed, $f_T$, of the transistor is consequently increased.

SUMMARY OF THE INVENTION

One aspect of the present invention is directed towards increasing operational speeds of transistor devices. In an illustrative embodiment, a transistor device includes a gate region disposed adjacent to a semiconductor substrate such that a low impedance channel is formed between a source region and drain region of a transistor device when a voltage is applied to its gate. The drain region of the device can be disposed aside the gate region on a common surface of the semiconductor substrate. The source region of the device also can be disposed adjacent to the substrate but on a side of the semiconductor substrate opposing the drain and/or gate regions. Based on this topology, a transistor device can be fabricated with a buried source to enhance its operating characteristics such as switching speed, gain, transconductance, etc.

A portion of the source region of the transistor device can be disposed directly opposite the gate region so that the semiconductor substrate is disposed between the gate and source regions. Consequently, a shorter distance can be achieved between the source and drain of the transistor device. Additionally, the gate region can be in contact with the channel (a semiconductor material) and cover a larger surface area than the source region. This aspect of the invention can vary depending on the application.

An insulation layer can be disposed adjacent to the semiconductor substrate opposite the gate region. For example, in one application, the semiconductor substrate is formed on an initially un-doped Silicon or Galium Arsenide substrate. The source region can be embedded within this non-conductive (or high impedance) layer, opposite the gate and drain of the transistor device. Based on this topology, the gate and/or source can be located on one side of the semiconductor substrate while the source can be disposed on another side of the semiconductor substrate or channel.

To support connections with other electronic devices, electrodes can be attached to the terminals of the transistor device. For example, an electrode can be electrically attached to the source region via an insulated conductor extending through the semiconductor substrate. Consequently, the gate, drain and source regions can be accessed from a common side of the transistor device. Alternatively, the source is accessed from a side of the semiconductor substrate opposite the drain.

The semiconductor substrate of the transistor device can be Gallium Arsenide. However, it should be noted that any suitable material can be used as a substrate.

The drain region can be disposed at an opposite end of the gate region with respect to the source region. Additionally, the drain region can be spaced from the gate region.

During operation, a voltage can be applied to the gate region to generate a depletion region deep enough in the semiconductor substrate so that a low impedance path is formed between the opposing drain and source regions.

Certain aspects of the present invention are advantageous over the prior art. For example, disposing a source opposite the drain region of a transistor device can shorten the path between the drain and source. As a consequence of shortening the travel path between the source and drain region, the transit time in the channel between gate decreases so that the switching speed of the device is thus increased.

Another aspect of the present invention is the enhanced electrical field profile afforded by disposing a source region beneath or opposing a gate region. More specifically, the average depth of a depletion region can be enlarged so that an effective capacitance of the device is smaller. That is, the gate to source capacitance can be reduced to increase its turn-on and turn-off time.

Faster switching transistor devices can be used to produce higher speed analog and digital electronic circuits. For instance, the speed of processor or amplifier circuits can be increased using the transistor devices according to certain principles of the present invention. The gain of a transistor can also be modified or enhanced.

Yet another aspect of the present invention, e.g., buried source, is that a transistor can occupy a much smaller area on a chip since the source is buried and the space between a corresponding source and gate can be eliminated. Therefor, an advantage of the novel device according to certain principles of the present invention is that a smaller device can be fabricated without necessarily changing corresponding resolution of the photolithography masks. Based on the new feature of burying the source beneath the gate, a conventional set of masks previously used to manufacture conventional transistor devices can be modified to form a transistor device according to certain principles of the present invention. For example, one change in fabrication procedure can involve connecting the source through a second layer of metalization. In a conventional MESFET device as in the prior art, the source is connected at the top metalization layer along with a corresponding gate and source.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

As mentioned in the summary of this specification, certain aspects of the present invention are directed towards improving characteristics of a transistor device. Among other improvements, the principles of the present invention can be used to: increase the operational frequency $f_T$ of a the transistor device, linearize the transconductance $G_m$, decrease the source-gate capacitance $C_g$, lower noise in the transistor device, modify gain characteristics of a transistor device, create a more linear electric field in a channel region, and/or simplify the steps of fabricating a transistor device.

Figure 1:
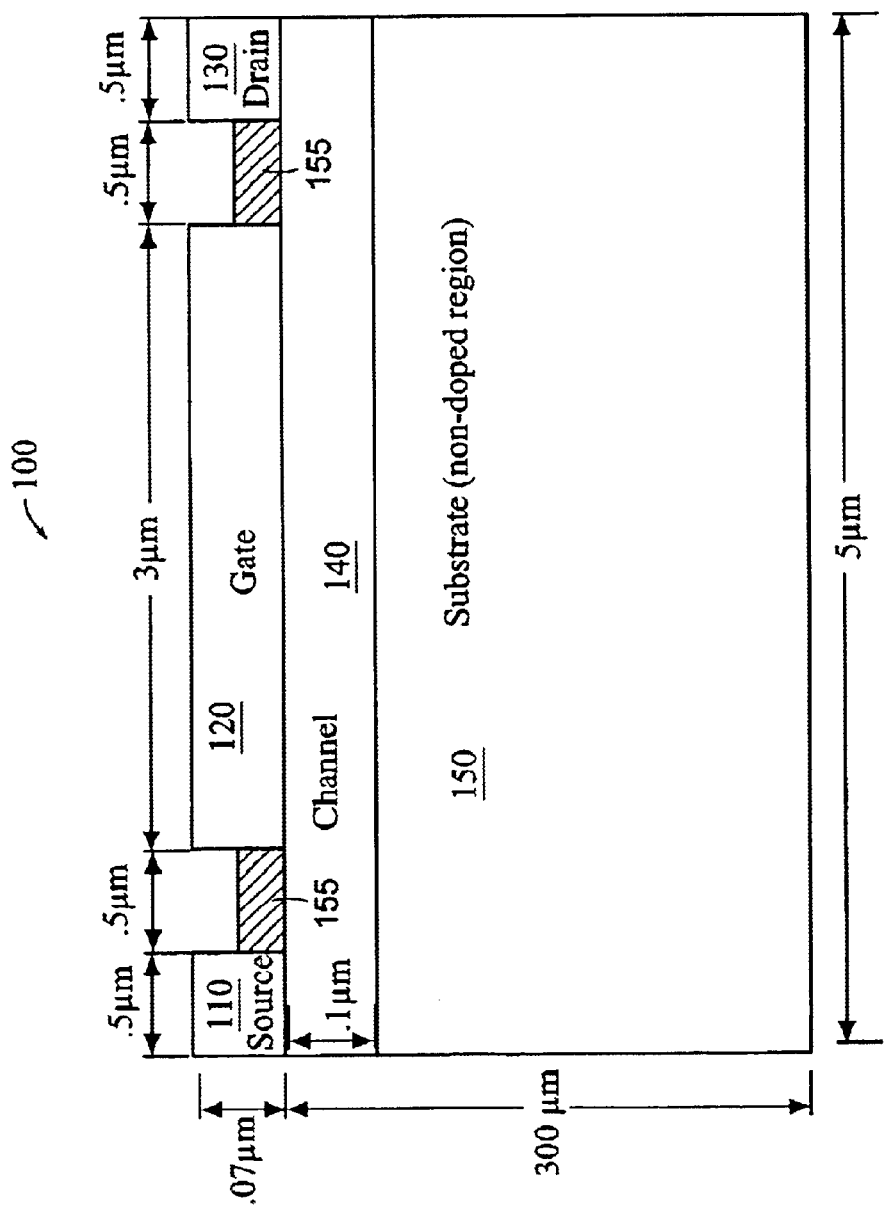
FIG. 1 is a cross-sectional view of a conventional transistor device as in the prior art.

FIG. 1 is a cross-sectional view of a conventional transistor device as in the prior art. A voltage can be applied to gate 120 to produce a conductive channel in layer 140 between source 110 and drain 130. Typically, transistor device 100 is formed on substrate 150. The transistor device 100 contains an un-doped insulation layer 155 for isolating the source 110 and the drain 130 from the gate 120 as is well known in the art.

Figure 2:
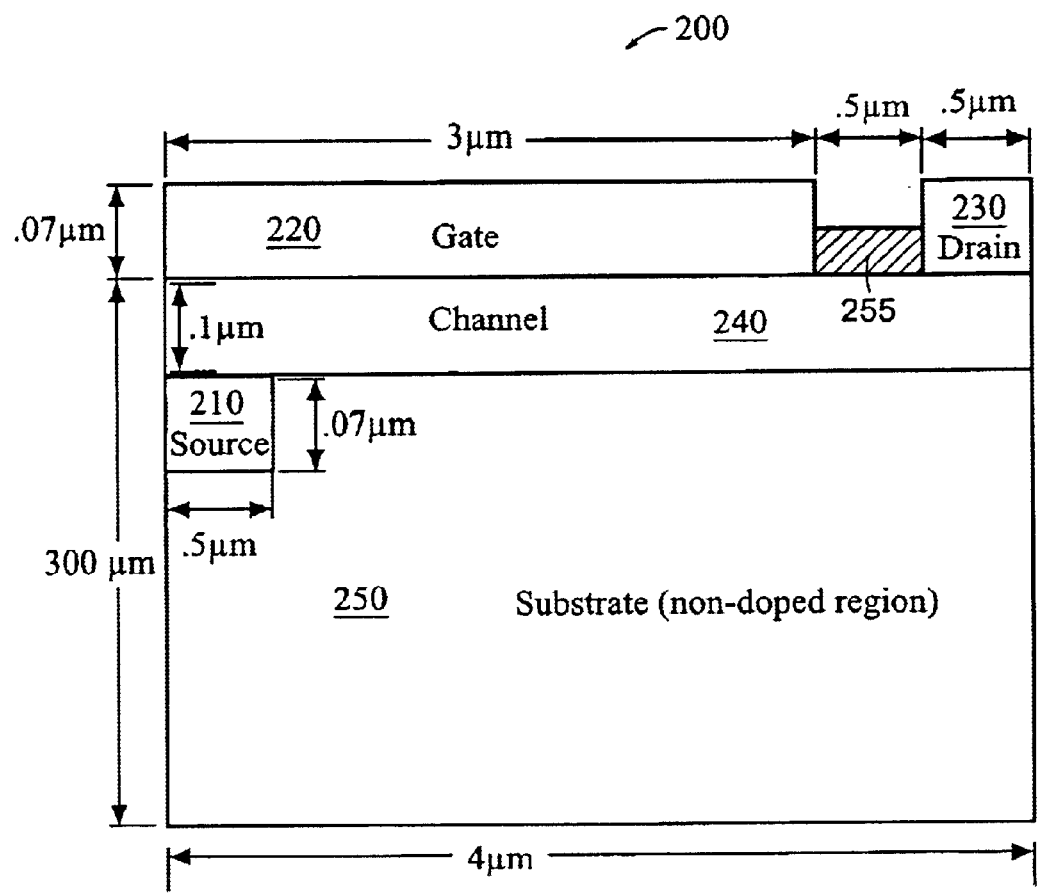
FIG. 2 is a cross-sectional view of a transistor device according to certain principles of the present invention.

FIG. 2 is a cross-sectional view of a transistor device according to certain principles of the present invention. As shown, transistor device 200 includes buried source 210. A precise positioning of source 210 opposite drain 230 or gate 220 can vary depending on the application. In the application shown, at least part of source region 210 is formed directly opposite gate region 220. Each layer in device 200 can be approximately planar or any other suitable shape. The transistor device 200 contains an un-doped insulation layer 255 for isolating the drain 230 from the gate 220 as is well known in the art.

During operation, a voltage is applied to gate 220 and a low impedance channel can be formed in layer 240 between source 210 and drain 230. The transit time of electrons (or charged particles) in layer 240 is reduced (compared to a transition time that for that shown in FIG. 1) since source 210 is closer to drain 230.

In one application, layer 240 is a GaAs substrate doped with an n-type or p-type material known in the art. Typical dimensions of transistor device 200 are as shown. However, these dimensions can vary depending on the application. In one application, layer 240 is an n-type channel doped with a concentration of 5×10 e+17 molecules per square centimeter and source 310 is doped with n+concentration of 1×10 e+19 molecules per square centimeter.

Figure 3:
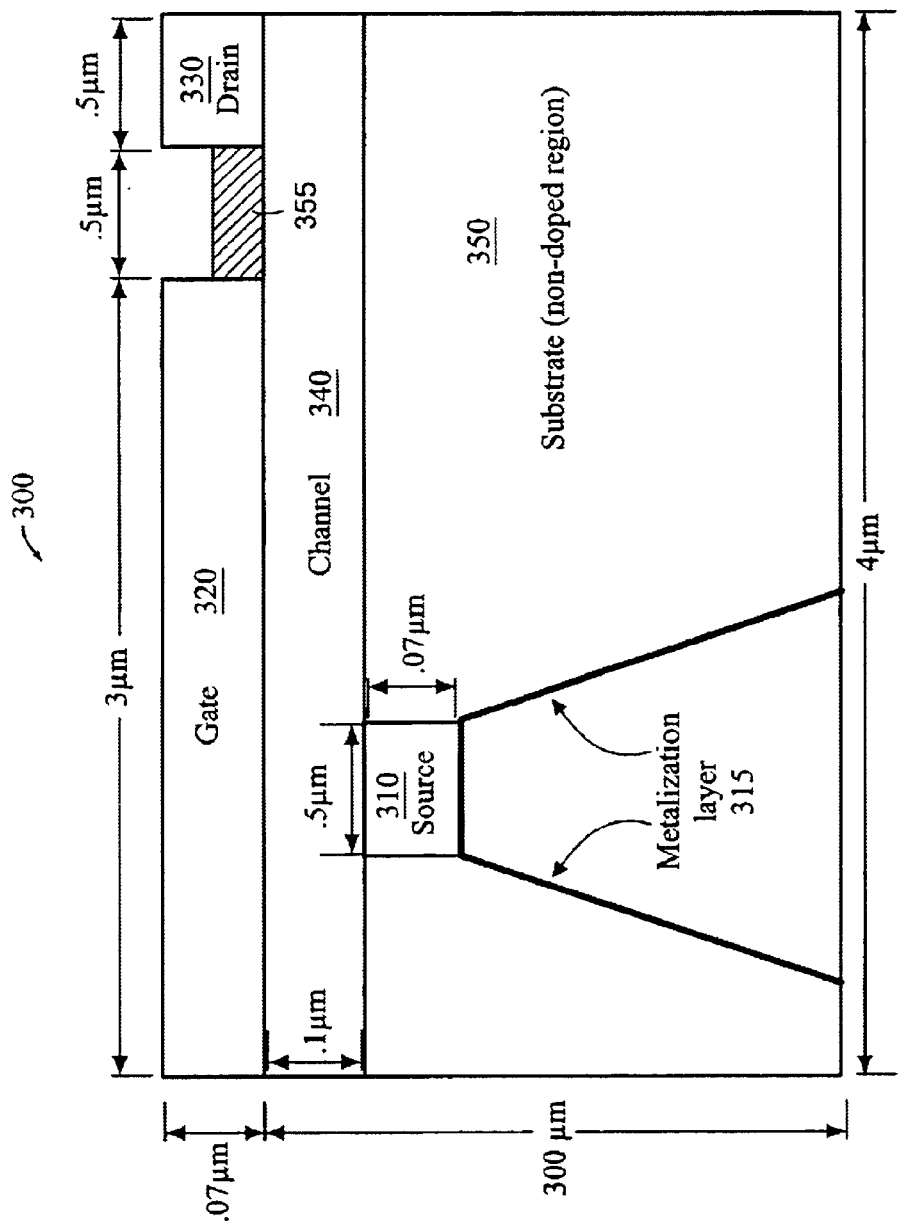
FIG. 3 is a cross-sectional view of a transistor device according to certain principles of the present invention.

FIG. 3 is a cross-sectional view of another transistor device according to certain principles of the present invention. Transistor device 300 includes buried source 310 that is electrically connected to metalization layer 315. As previously mentioned, a precise positioning of source 310 opposite drain 330 or gate 320 can vary depending on the application. In the application shown, all of source region 310 can be formed so that it is directly opposite gate 320. The transistor device 300 contains an un-doped insulation layer 355 for isolating the drain 330 from the gate 320 as is well known in the art.

In one embodiment, transistor device 300 is at least partly manufactured using conventional planar technology with certain modifications. For example, according to the principles of the present invention, a v-shaped or cone-shaped contact such as metalization layer 315 can be formed for connecting electrical circuit paths to buried source 310 of transistor device 300.

Transistor device 300 can be fabricated by doping selected regions of substrate 350 similar to that discussed in FIG. 2. Many different doping concentrations can be used to fabricate transistor devices for use of the devices in different applications.

Lithography masks for source contact 315 depend on a particular application of use. For instance, the size of source 310 and gate 320 can vary depending on whether the device is used for amplification or switching, low versus high power, etc.

In general, the size of a corresponding electrode of transistor device 300 controls precision and tolerances. This leaves margin for specifying the geometry of the device and etching with various rates.

A reduction of transistor dimensions can be achieved using a vertical design to connect to source 310. The technology of manufacturing a widely used V-groove and new vertical trench-etching FET structures typically includes single top layer or double layer metalization. In general, a transistor device can be manufactured using conventional processing techniques.

For example, transistor device 300 including buried source 310 presents a semi-planar structure. A use of a metal contact 315 coupled to buried source 310 as in FIG. 3 can be achieved by minor modifications to existing masking techniques.

In transistor device 300, metal contact 315 can be attached to the bottom of source region 310 as shown. This is an improvement to the conventional devices in which metalization is done at the top layer.

In general, to fabricate transistor device 300, the backside (bottom as shown in figure) of the wafer is etched to reach the source of the transistor from the bottom. As a result of an alignment of wet or dry chemical etching, the source will be the top of a cone shaped hole. Metalization of the walls and the top of this cone will provide electrical contact to the source.

Doping to produce source 310 can be done before or after etching.

A process for manufacturing a transistor device according to the principles of the present invention can include Reactive Ion Etching (REI). This technology is widely used for making via-through connections. This process can include a parallel plate reactor in which semiconductor wafers being processed rest on powered electrodes. In general, an electric field can be generated to control a direction of etching material.

A neutral electrode can be attached to a chamber wall to enlarge its effective area. Chlorine gas is commonly described as plasma that is simply ionized gas. The plasma can be kept in close contact with chamber walls for high potential difference from plasma to charged electrode. This will accelerate the energy of ion bombardment for high etching rate. As the pressure inside the chamber increases, the plasma contracts and loses contact with the walls. As a result, low pressures are typically used for effective etching in parallel plate reactors.

One consideration for a high etch rate is the removal of contaminants from the wafer. The chemical formulas below describe the process of gallium arsenide RIE with chlorine gas:

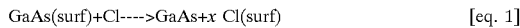
$$GaAs(surf) + Cl \longrightarrow GaAs + x\ Cl(surf) \qquad [eq.\ 1]$$

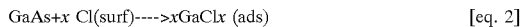
$$GaAs + x\ Cl(surf) \longrightarrow xGaCl_x\ (ads) \qquad [eq.\ 2]$$

An etching process can include multiple steps. First, chlorine plasma can be directed so that it comes in contact with the wafer or, more specifically, an exposed surface of substrate 350. This results in a deposition of chlorine ions on a selected region of substrate 350 such as Gallium Arsenide. The deposited chlorine ions bond to Gallium Arsenide of substrate 350 to result in a charged gallium chloride radical which can eventually free itself from the surface.

Possible contaminants include unreacted chlorine ions and other derivatives of gallium chloride. Argon gas can be used to lift any contaminants impeding the flow of chlorine plasma. Because Argon is an inert gas, there is typically little or no contamination due to potential by-products.

A ratio of chlorine to argon gas has been studied closely to determine the most effective etch rate in gallium arsenide. When the substrate is exposed to a 4-to-1 ratio of Chlorine to Argon gas flow, the chlorine gas typically reflects off the substrate by argon gas and attacks the sidewalls under high $Cl_2$ concentration. This can affect the etching profile by severely undercutting the gallium arsenide wafer.

Also, etching can be inhibited by over-saturating a surface with chlorine atoms. With more diluted gas stream, such as a 1:4 ratio of $Cl_2$ to Ar gas flow, a vertical side wall etch rate of 800 nm/min can be achieved. Lower $Cl_2$ concentration can prevent undercutting a wafer.

A high Ar concentration exposes the wafer for effective etching by chlorine plasma. This etch rate is established with 5 m Torr pressure, 200 V bias voltage, gas flow for reactive $Cl_2$ at 5×10e+18 molecules cm-2 s-1 and insert Ar at 20×10e+18 molecules cm-2 s-1. For 300 mm thickness of our wafer RIE process of GaAs in $Cl_2$ plasma and Ar gas will require 3.25 hours. It is known that long periods for RIE process may result in undercutting the sidewalls and produce vias not of cylindrical but of cone shape. Many other suitable shapes can be achieved via etching.

Additional steps for manufacturing a transistor device can include:

a) lithography for patterning the size and position of via-trough at the back of the wafer, b) an REI process to reach the source site from the back of the wafer, c) metalization using vapor deposition of gold.

For vias having a smaller size diameter, it is sometimes advantageous to etch out a large trench at the back of the wafer (by thinning the wafer below the transistor) and then use the steps described above.

Figure 4:
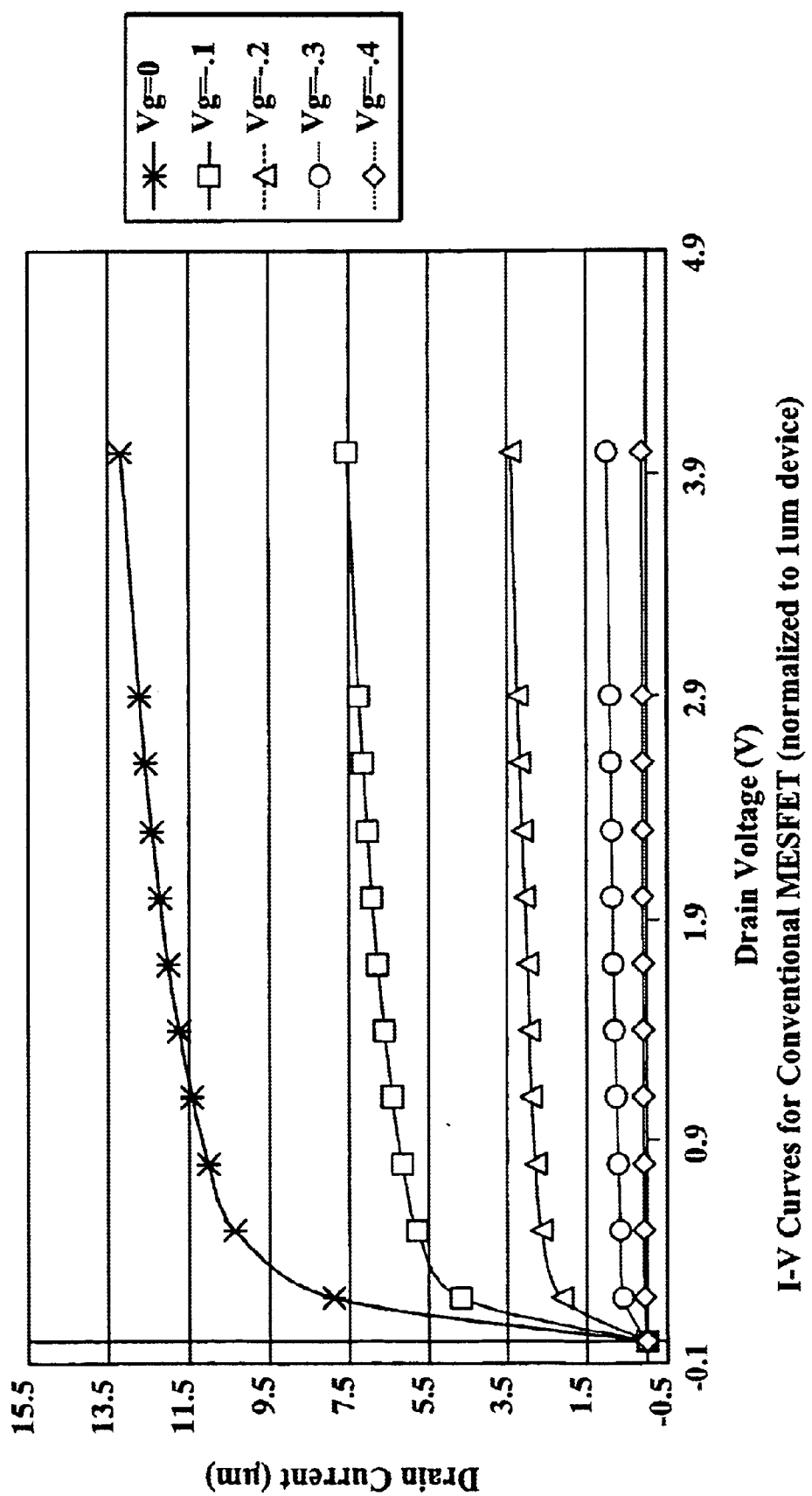
FIG. 4 is a graph illustrating operational characteristics of a conventional MESFET device.
Figure 5:
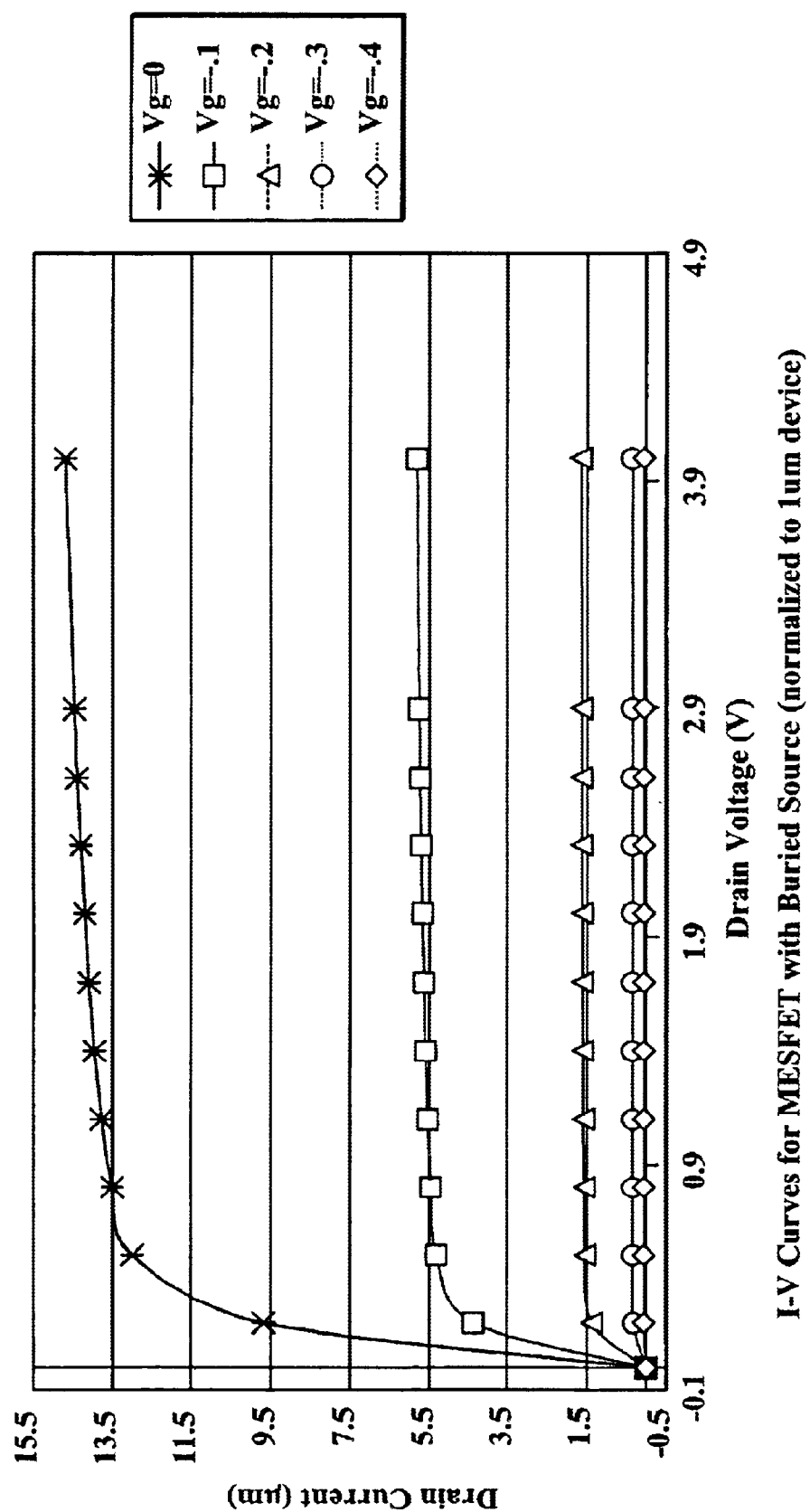
FIG. 5 is a graph illustrating operational characteristics of a transistor device according to certain principles of the present invention.

FIG. 4 is a graph illustrating a current-voltage characteristics of a conventional transistor device. These characteristics can be compared to the characteristics of a comparable transistor device fabricated with a buried source as shown in FIG. 5. The test device producing the operational characteristics of the transistor devices in FIGS. 4 and 5 are shown in FIGS. 1 v. FIGS. 2 and 3. Dimensions are indicated as shown and channel doping is 5×10 e+17.

Certain advantages of the present invention are graphically illustrated in FIG. 5. For example, a saturation of the electron velocity appears at lower drain voltages for MESFET transistor devices fabricated with a buried source versus those of conventional MESFETs (FIG. 4) that require higher voltages to achieve saturation.

A spacing between I-V curves is typically related to the value of $g_m$. For example, a larger $g_m$ and better turn-on characteristics can be achieved based on a larger spacing between I-V curves. In certain applications, it is preferred that the I-V curves have equal spacing, indicating a linear value for $g_m$.

The capacitance $C_{gs}$ can be defined as:

$$C_{gs} = A(\epsilon \epsilon_o)/d \qquad \text{(equation 3)},$$

where A is area of a corresponding gate, $\epsilon$ is a dielectric constant of semiconductor material, $\epsilon_o$ is the dielectric constant of vacuum. Typically, all parameters, besides the depth of the depleted region in equation 1, are the same for conventional MESFETs (FIG. 1) and FET devices with a buried source as shown in FIGS. 2 and 3.

Figure 6:
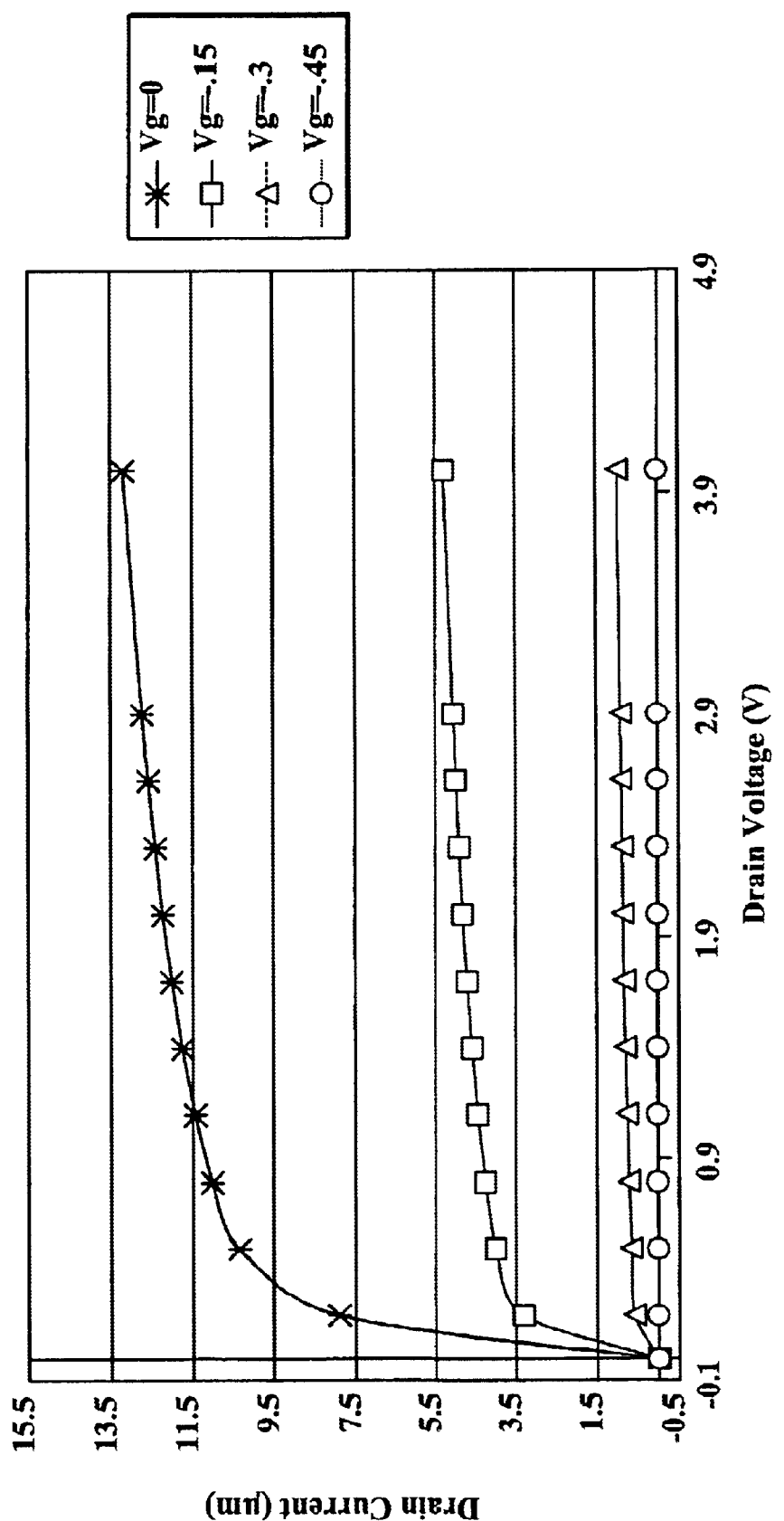
FIG. 6 is a graph illustrating operational characteristics of a conventional MESFET device.
Figure 7:
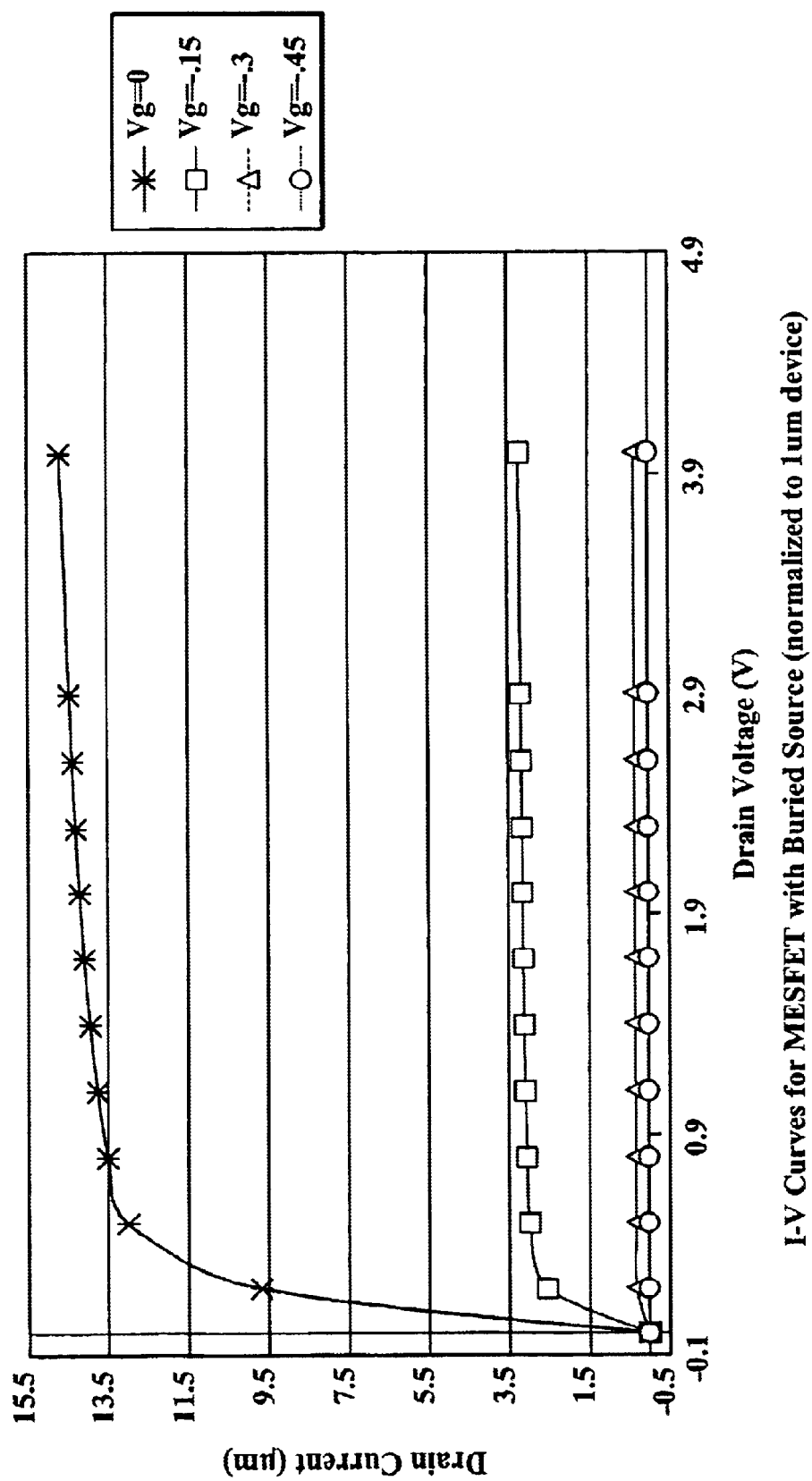
FIG. 7 is a graph illustrating operational characteristics of a transistor device according to certain principles of the present invention.

FIG. 6 is a graph illustrating a current-voltage characteristics of a conventional transistor device. These characteristics can be compared to the characteristics of a comparable transistor device fabricated with a buried source as shown in FIG. 7. The test device producing the operational characteristics of the transistor devices in FIGS. 6 and 7 are shown in FIGS. 1 v. FIGS. 3. Dimensions are indicated as shown and channel doping is 1×10 e+17. Based on the drain current versus drain bias voltage curves for each Vgs, it is shown that the transistor device according to the principles of the present invention has a higher gain and more desirable transconductance for a comparably sized device.

Figure 8:
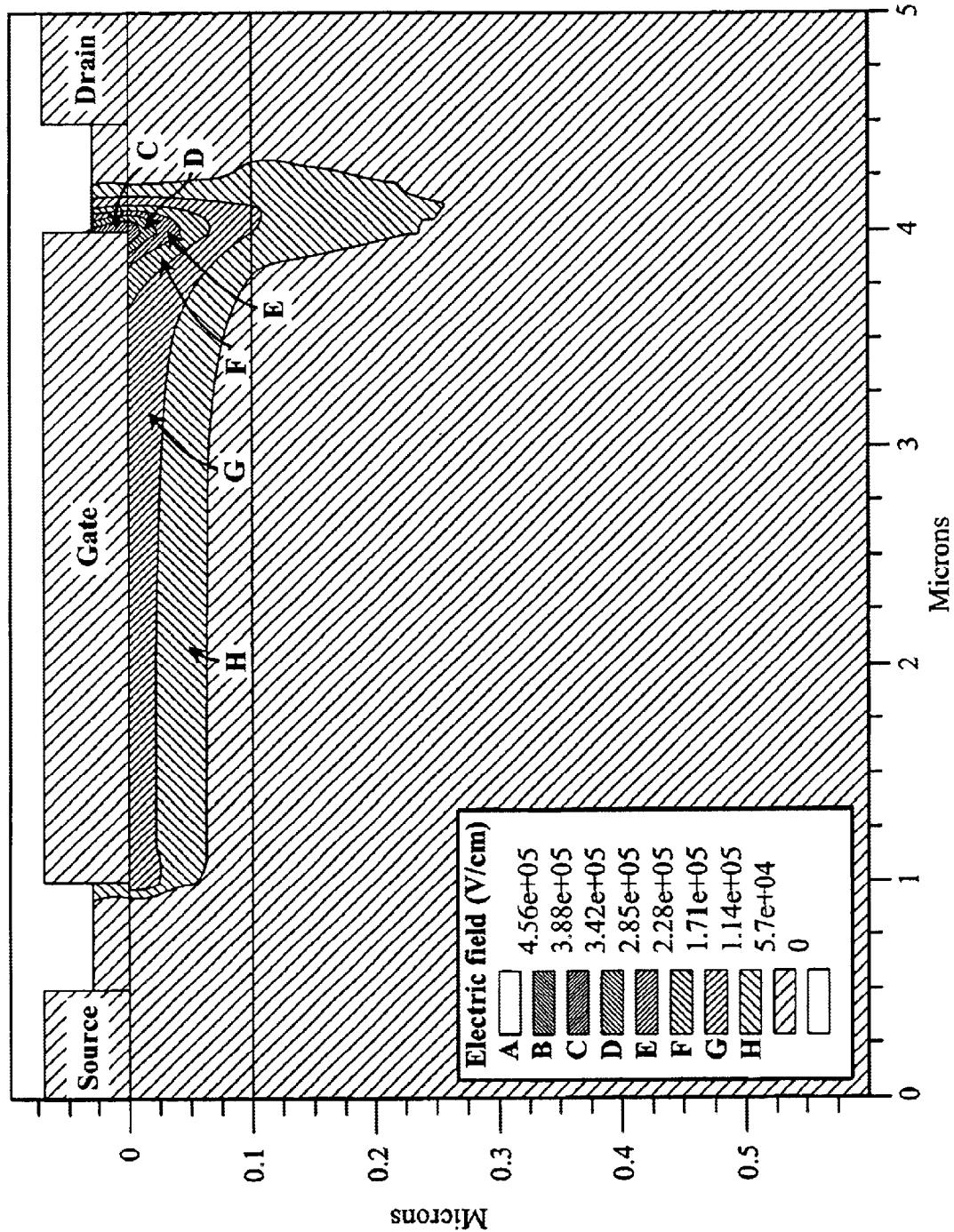
FIG. 8 is a side view diagram illustrating an electric field in a conventional MESFET device.

FIG. 8 is a cross-sectional diagram illustrating an electric field produced in a conventional transistor device. As shown, the electric field in the channel is generally not uniform or linear due to the application of the voltage to the gate and drain of the transistor device such as a MESFET (Metal Semiconductor Field Effect Transistor).

Figure 9:
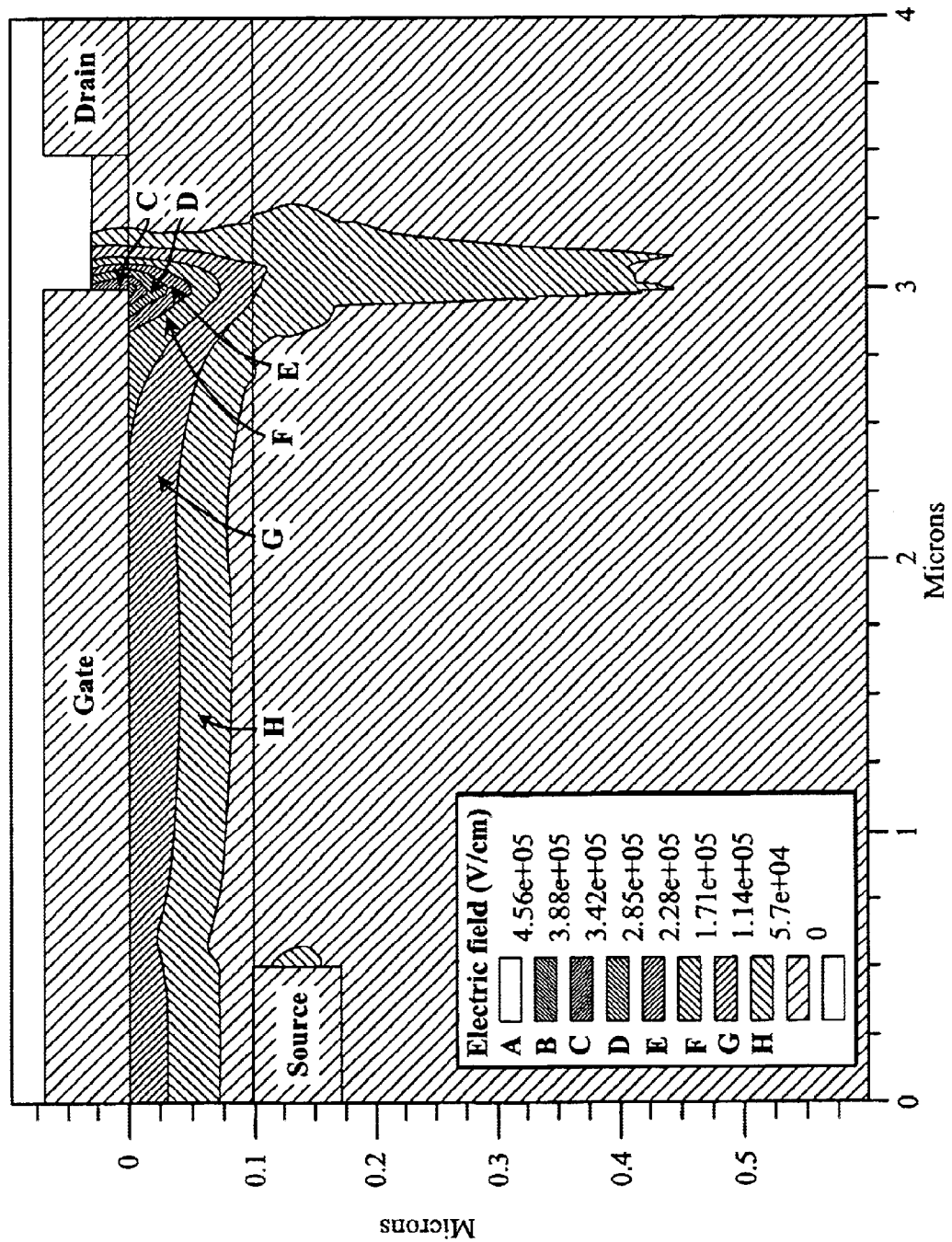
FIG. 9 is a side view diagram illustrating an electric field in a transistor device according to certain principles of the present invention.

FIG. 9 is a cross-sectional diagram illustrating an electric field produced in a transistor device including a buried source according to the principles of the present invention. Comparing the electric field profile of an FET transistor device including a buried source (as shown in FIG. 9) according to the principles of the present invention and a conventional FET device (as shown in FIG. 8), the average depth of the depletion region in FIG. 8 for the FET device of the present invention is larger, i.e., $C_{gs}$ is smaller. The noise figure $N_f$ is inversely proportional to $G_m$.

More particularly, one aspect of the present invention involves tailoring an electrical field in the channel of an FET to produce a more uniform electric field. For example, a source of an FET device can be buried beneath a gate. Based on this technique, physical attributes such as channel length of the FET can be reduced so that the FET device itself can be smaller and, thus, faster. Preferably, such a device is fabricated at least in part using conventional processing technology.

According to other principles of the present invention, an electrical field of an FET is tailored based on a single gate transistor device with a buried source as shown in FIGS. 2 and 3. One potential advantage of such a configuration is higher average velocity of electrons traveling through the channel of the transistor device. Thus, one aspect of the present invention is directed towards tailoring an electric field of a transistor device so that the field is more linear or uniform for a longer portion of the corresponding channel region.

Other methods of tailoring electric fields in a semiconductor device can be found in related U.S. Pat. No. 6,037,830, the entire teachings of which are incorporated herein by this reference. More specifically, the techniques discussed in the above-referenced patent can be used in conjunction with the one aspect of that disclosure involves increasing the average velocity of electrons by manipulating the electrical field between a gate and source.

To control or tailor the electrical field in a MESFET in the U.S. Pat. No. 6,037,830 patent, we suggest applying voltages to two or more gates of the transistor devices. For example, a higher voltage can be applied to a first gate than a second gate of the same device, e.g., Vg1>Vg2. Also, two or more gates with specially balanced voltages can provide an $f_T$ of about 30 GHz. Generally, $f_T$ of a FET device can be limited as a result of a relatively long channel of the MESFET or a long gate formed by a combination of two or more gates.

An overall advantage of the novel feature of burying the source is that the transistor can be fabricated to occupy a much smaller area on a chip since the source is buried and the space between source and gate can be eliminated. A smaller device can be fabricated without changing the resolution of standard photolithography techniques. However, based on the new feature of burying the source beneath the gate, a conventional set of masks need only slight modifications. For example, one change in fabrication procedure can involve connecting the source through a second layer of metalization as shown in FIG. 3. In a conventional MESFET device, the source is connected at the top metalization layer as shown in FIG. 1.

In addition to $f_T$ and $g_m$, other important parameters such as RF efficiency, linearity of $g_m$, noise figure $N_f$ are improved by modification of geometry of FET.

While this invention has been particularly shown and described with references to preferred embodiments thereof, it will be understood by those skilled in the art that various changes in form and details may be made therein without departing from the scope of the invention encompassed by the appended claims.

What is claimed is:

1. A transistor device, comprising:

a longitudinally extending non-doped substrate;

a source region extending within and along a longitundinal distance that is substantially shorter than a longitudinal extent of the substrate;

a channel layer doped less than the source region formed over the source region and the substrate, such that the source region does not extend into the channel layer; and a gate region and a drain region commonly disposed on a main surface of said channel layer and not extending into the channel layer; said drain region being separated from said gate region; wherein said gate region is disposed vertically adjacent and across said channel layer from said source region.

2. The transistor device as in claim 1, wherein at least a portion of the source region is disposed vertically opposite the gate region and the channel is disposed between the gate and source regions.

3. The transistor device as in claim 2, wherein the gate region is in contact with the channel layer and covers a larger surface area than the source region.

4. The transistor device as in claim 1, wherein an electrode is electrically attached to the source region via an insulated conductor extending through the channel layer.

5. The transistor device as in claim 1, wherein the channel layer is formed of Gallium Arsenide.

6. The transistor device as in claim 1, wherein a voltage applied to the gate region generates a depletion region deep enough in the channel layer such that an impedance channel is formed between the drain and source regions.

7. The transistor device as in claim 1, wherein the transistor device is fabricated at least in part based on MESFET technology.

* * * * *